United States Patent [19]
Takemura

[11] Patent Number: 5,374,846
[45] Date of Patent: Dec. 20, 1994

[54] BIPOLAR TRANSISTOR WITH A PARTICULAR BASE AND COLLECTOR REGIONS

[75] Inventor: Hisashi Takemura, Tokyo, Japan

[73] Assignee: NEC Corporation, Japan

[21] Appl. No.: 108,830

[22] Filed: Aug. 18, 1993

Related U.S. Application Data

[63] Continuation of Ser. No. 753,818, Sep. 3, 1991, abandoned.

[30] Foreign Application Priority Data

Aug. 31, 1990 [JP] Japan .................. 2-231658

[51] Int. Cl.⁵ .................. H01L 27/082; H01L 29/40
[52] U.S. Cl. .................. 257/592; 257/587; 257/588
[58] Field of Search .............. 357/35, 34, 36; 257/656, 592, 593, 565, 592, 593, 591, 587, 588

[56] References Cited

U.S. PATENT DOCUMENTS

| 3,312,881 | 4/1967 | Yu | 252/593 |
| 4,887,145 | 12/1989 | Washio et al. | 257/593 |

FOREIGN PATENT DOCUMENTS

| 0425242 | 4/1991 | European Pat. Off. | 257/593 |
| 2549293 | 1/1985 | France | 257/593 |
| 3903284 | 8/1989 | Germany | 257/592 |
| 0126478 | 10/1979 | Japan | 257/593 |

*Primary Examiner*—Rolf Hille
*Assistant Examiner*—Wael M. Fahmy
*Attorney, Agent, or Firm*—Laff, Whitesel, Conte & Saret, Ltd.

[57] ABSTRACT

A silicon film 9 and an N+-type impurity region 9a are provided between a base region 11 and an epitaxial growth layer 3. A silicon oxide film 12 is provided on the inner sidewalls of an opening 16, and an N-type polycrystalline silicon film 13 and an emitter region 15 are provided in the region surrounded by the silicon oxide film 12.

The silicon film 9 is formed by means of a molecular beam epitaxy and the N-type impurity region 9a is formed prior to the formation of the base region 11 by means of ion implantation that uses a silicon oxide film 7 as the mask. As a result, it is possible to suppress the reduction in the cut-off frequency, and reduce the capacity between the base and the collector, so that a high speed operation of the bipolar transistor becomes possible.

10 Claims, 6 Drawing Sheets

BIPOLAR TRANSISTOR WITH A PARTICULAR BASE AND COLLECTOR REGIONS

This application is a continuation of application Ser. No. 07/753,818, filed Sep. 3, 1991 now abandoned.

BACKGROUND OF THE INVENTION

1. Field of the Invention

The present invention relates to a bipolar transistor and a fabrication method thereof, and more particularly, to a bipolar transistor having beneath an emitter region an impurity region with the same conductivity type as that of the emitter region and a fabrication method thereof.

2. Description of Releated Art

FIG. 8 shows a sectional view of a prior art bipolar transistor.

On the surface of a P-type silicon substrate 1 there is selectively formed a silicon oxide film for element isolation, and the substrate 1 is subdivided into a plurality of element regions by the silicon oxide film 4. In each of the element regions there is provided a buried collector region 2 doped with an N-type impurity, and an epitaxial growth layer 3 with thickness of about 1 $\mu$m is formed on the buried collector region 2. In the epitaxial growth layer 3 there is selectively formed a collector connecting region 2a which reaches from the surface of the layer 3 to the buried collector region 2.

On the epitaxial growth layer 3 there is selectively formed a base region 11, and an emitter region 15 is selectively formed on the surface of the base region 11. In addition, an insulating film 5 is formed on the epitaxial growth layer 3 exclusive of the formation region of the base region and on the silicon oxide film 4. On the insulating film 5 there is selectively formed a P-type polycrystalline silicon film 6 for base lead-out. The polycrystalline silicon layer 6 is electrically connected to the base region 11 via a P-type polycrystalline silicon film 10 which is selectively formed on the base region 11.

On the insulating film 5 inclusive of the part over the polycrystalline silicon film 6 there is formed a silicon oxide film 7. An aluminum electrode 14 fill in a contact hole 7a provided in the silicon oxide film 7, and is electrically connected to the polycrystalline silicon film 6. Further, over the base region 11 there is formed an opening 16 which reaches from the surface of the silicon oxide film 7 to the base region 11, and a silicon oxide film 12 is formed on the sidewalls of the opening 16. Moreover, an N-type polycrystalline silicon film 13 which is filled in the opening 16 is selectively connected to the emitter region 15. The N-type polycrystalline silicon film 13 is formed in such a manner as to extend somewhat over the silicon oxide film 7 from the interior of the opening 16. On the N-type polycrystalline silicon film 13 there is formed an aluminum electrode 14. Further, over the collector connecting region 2a there is provided a contact hole 7b which reaches from the surface of the silicon oxide film 7 to the collector connecting region 2a, and the contact hole 7b is filled in with the aluminum electrode 14 which is formed on the silicon oxide film 7 according to a predetermined pattern.

In order to operate at high speed the elements of the prior art bipolar transistor constructed as in the above, it becomes necessary to suppress the reduction in the cut-off frequency due to the base push-out effect (the so-called Kirk effect) at high current domain. For this purpose, one may try to increase the concentration of the N-type impurity in the epitaxial growth layer 3, or dope N-type impurity atoms to the portion of the epitaxially deposited layer 3 which is below the emitter region 15. However, if the concentration of the N-type impurity for the entirety of the epitaxial growth layer 3 is increased, the epitaxial growth layer with high impurity concentration is brought into contact with a wide range of the bottom surface of the base region 11, so that, although the cut-off frequency can surely be made high, the capacity between the collector and the base is increased, which obstructs the increase in the operating speed of the elements. Further, the breakdown voltage between the collector and the base is also deteriorated. Therefore, this approach cannot be said realistic.

Now, the epitaxial growth layer 3 is formed by epitaxially growing silicon on the buried collector region 2 at a temperature above 900° C. Since impurity atoms diffuse by auto-doping to the epitaxial growth layer 3 from the buried collector region 2 during the time of formation of the epitaxial growth layer, the impurity concentration in the epitaxial growth layer 3 becomes high also in the region other than the region where the N-type impurity atoms are added. As a result, the collector-base capacity between the base region 11 and the region of the epitaxial growth layer 3 exclusive of the region of addition of the N-type impurity atoms becomes high, making a full increase of the operating speed of the elements unachievable.

SUMMARY OF THE INVENTION

It is the object of the present invention which was conceived in view of the aforementioned problems to provide a bipolar transistor which is capable of suppressing the reduction in the cut-off frequency due to the base push-out effect and operating at high speed with small capacity between the collector and the base, and a fabrication method of such a bipolar transistor.

A bipolar transistor according to the present invention is characterized in that it includes a collector region provided on the surface of a semiconductor substrate, a silicon film provided on the collector region, a first conductivity type base region formed on the silicon film, a second conductivity type emitter region selectively formed on the surface of the base region, and an impurity region of the second conductivity type formed in a part of the silicon film which includes at least the region substantially beneath the emitter region and has an impurity concentration higher than in the other part.

A fabrication method of a bipolar transistor according to the present invention is characterized in that it includes the steps of forming a collector region on the surface of a semiconductor substrate, forming selectively a silicon film on the collector region by means of a molecular beam epitaxy method, forming an impurity region on the silicon film by a selective introduction of a second conductivity type impurity, forming a first conductivity type base region on the silicon film inclusive of the impurity region, and forming an emitter region of the second conductivity type on the surface of the base region which includes at least the region substantially over the impurity region.

Another fabrication method of a bipolar transistor according to the present invention is characterized in that it includes the steps of forming a collector region of one conductivity type on the surface of a semiconductor substrate, forming selectively a silicon film on one principal surface of the collector region, forming a base region of the opposite conductivity type on the silicon film, forming a high concentration region of the one conductivity type in the silicon film by selectively introducing the one conductivity type impurity atoms, and forming an emitter region of the one conductivity type on one principal surface of the base region which is substantially over the high concentration region.

In accordance with the present invention, a silicon film is arranged beneath a base region of a first conductivity type, and an impurity region of a second conductivity type with impurity concentration higher than in the other parts is provided on the silicon film aligned with an emitter region. The silicon film is different from the conventional epitaxial growth layer, and is arranged between an epitaxial growth layer and the base region. With this arrangement, it is possible to suppress the diffusion of impurity atoms from a collector region including a buried collector region to the silicon film, making it possible to maintain the impurity concentration of the silicon film at a predetermined level. Because of this, it is possible to reduce the capacity between the silicon film and the base region. Consequently, the bipolar transistor in accordance with the present invention is capable of suppressing the reduction in the cut-off frequency due to the base push-out effect, and can be operated at high speed.

It should be noted that the diffusion of the impurity atoms from the collector region to the silicon film can be suppressed by forming the silicon film by means of an ultra high vacuum CVD method or a molecular beam epitaxy method since the temperature at the time of the formation can be chosen relatively low. Accordingly, it is preferable that the aforementioned silicon film be formed by an ultra high vacuum CVD method or a molecular beam epitaxy method.

Moreover, in the fabrication method of the bipolar transistor according to the present invention, first, a collector region is formed on the surface of a semi-conductor substrate, then a silicon film is selectively formed on the collector region by an ultra high vacuum CVD method or a molecular beam epitaxy method. In ultra high vacuum CVD and molecular beam epitaxy it is possible to form a silicon film at a relatively low temperature. Accordingly, at the time of formation of the silicon film it is possible to suppress the diffusion of the impurity atoms from the collector region to the silicon film, and maintain the impurity concentration of the silicon film at a predetermined level. Then, after forming an impurity region of a second conductivity type by selectively introducing impurity atoms to the silicon film, a base region of a first conductivity type is formed on the silicon film inclusive of the impurity region. Subsequently, an emitter region is formed in a part of the surface of the base region which includes at least the region directly over the impurity region of the second conductivity type. In this manner, according to the fabrication method of the present invention, it is possible to readily fabricate a bipolar transistor which possesses the aforementioned structure, has a small capacity between the collector and the base and can be operated at high speed.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DESCRIPTION OF THE PREFERRED EMBODIMENTS

Next, referring to the accompanying drawings, the embodiments of the present invention will be described.

Figure 1:
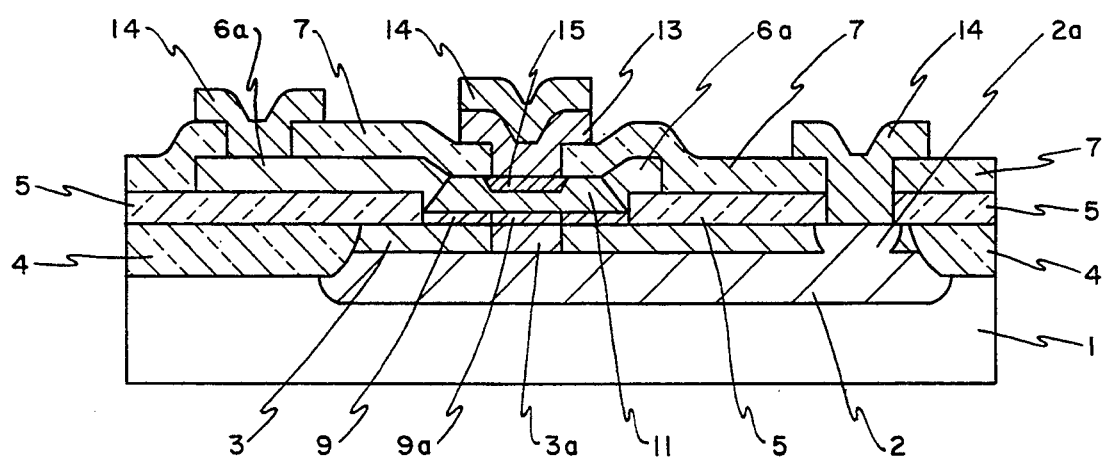
FIG. 1 is a sectional view of the bipolar transistor according to a first embodiment of the present invention.

FIG. 1 is a sectional view of the bipolar transistor according to the first embodiment of the present invention, and FIG. 2 shows sectional views arranged in the order of fabrication processes for describing the fabrication method of the first embodiment.

Figure 2A:
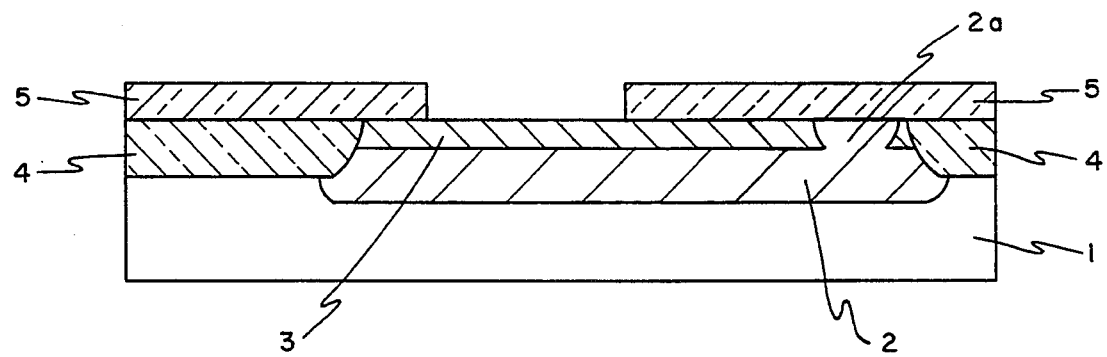
FIGS. 2(a) and (b) shows sectional views arranged in the order of the processes of fabricating the first embodiment of the bipolar transistor of the present invention.

First, as shown in FIG. 2(a), on a silicon substrate 1 there are formed a buried collector region 2 having an impurity concentration of arsenic of $10^{19}$ atom/cm$^3$, an epitaxial growth layer 3 having an impurity concentration of phosphorus of $10^{16}$ atom/cm$^3$, a collector connecting region 2a with an impurity concentration of phosphorus of $10^{18}$ to $10^{19}$ atom/cm$^3$ and a silicon oxide film 4 formed by a selective oxidation method. Then, an insulating film 5 (such as a silicon oxide film with thickness of about 1000 Å) is formed allover the surface, and the insulating film 5 is patterned by a photolithography method.

Figure 2B:
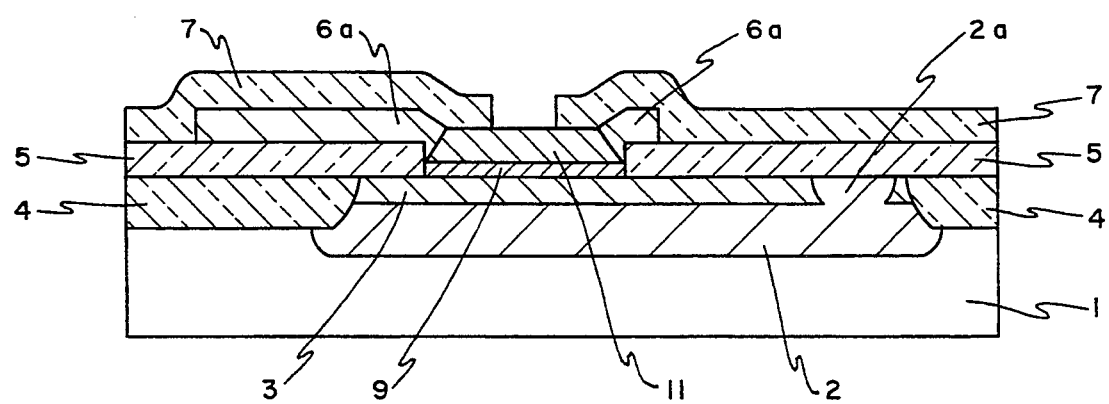

Next, as shown in FIG. 2(b), a silicon film 9 with a thickness of 100 to 1000 Å is formed on the epitaxial growth layer 3 exposed to the insulating film 5 by molecular beam epitaxy or ultra high vacuum CVD. When a molecular beam epitaxy method is employed for the formation, the formation conditions may be set, for example, to send disilane and phosphine which supplies an N-type impurity, under a temperature in the range of 300 to 500° C. and a growth pressure of $10^{-6}$ Torr. On the other hand, when an ultra high vacuum CVD method is employed for the formation, the formation conditions may be set, for example, to supply disilane and phosphine under a temperature in the range of 570 to 700° C. and a deposition pressure of $10^{-4}$ Torr. Next, silicon film doped with boron atoms of a concentration of 2 to $4 \times 10^{18}$ atom/cm$^3$ is formed allover the surface to a thickness of about 1000 Å by a photo enhanced epitaxy method or a low temperature epitaxy method.

As a result of the above-mentioned process, the silicon film doped with boron atoms is converted to a polycrystalline silicon film 6a over the insulating film 5, and is converted to a single crystal silicon film, thereby forming a base region 11. Next, after patterning the polycrystalline silicon film 6a by photolithography, a silicon oxide film 7 is formed to a thickness of about 2000 Å by a CVD method. Then, the silicon oxide film 7 in the region reserved for the formation of an emitter is selectively removed to create an opening as shown in the figure.

Next, as shown in FIG. 1, regions 9a and 3a with high concentration of N-type impurity are formed by doping, for example, phosphorus atoms by an ion implantation method under a dose of $2 \times 10^{12}$ atom/cm$^2$ and an implantation energy of 200 keV into the silicon film 9 and the epitaxially deposited layer 3 through the opening in the silicon oxide film. During this process the phosphorus atoms are also added to the base region 11, but the N-type impurity is doped at a concentration which is sufficiently lower than the concentration of the P-type impurity in the base. Therefore, the N-type region is formed only in the region directly beneath the base region. Then after formation allover the surface of an N-type polycrystalline silicon film doped with arsenic atoms of $10^{20}$ to $10^{21}$ atom/cm$^3$, the polycrystalline silicon film 13 is patterned. Subsequently, an emitter region 15 with a peak impurity concentration of $10^{20}$ atom/cm$^3$ is obtained by diffusing arsenic atoms from the polycrystalline silicon film 13 into the base region 11 by subjecting the sample to a heat treatment. Then, contact holes for leading out the base and the collector are formed selectively, and an aluminum electrode 14 is selectively formed over the contact holes and the polycrystalline silicon film 13. In this manner, the bipolar transistor according to the present embodiment is completed. It should be noted that the process of the present embodiment is also applicable to a simplified structure in which the base region and the base lead-out region are formed in a single deposition of a silicon film. Moreover, according to the present embodiment, the contacting shape between the base region 9 and the epitaxially deposited layer 3 is determined by photolithography, so that the contact area between the base and the collector becomes larger than in the self-aligned bipolar transistor mentioned in connection with the prior art. Accordingly, by the insertion of a silicon layer 9 with lower impurity concentration it becomes possible to obtain a reduction rate of the collector-base capacity which is greater than in the case of applying the present invention to the self-aligned type device.

Figure 3:
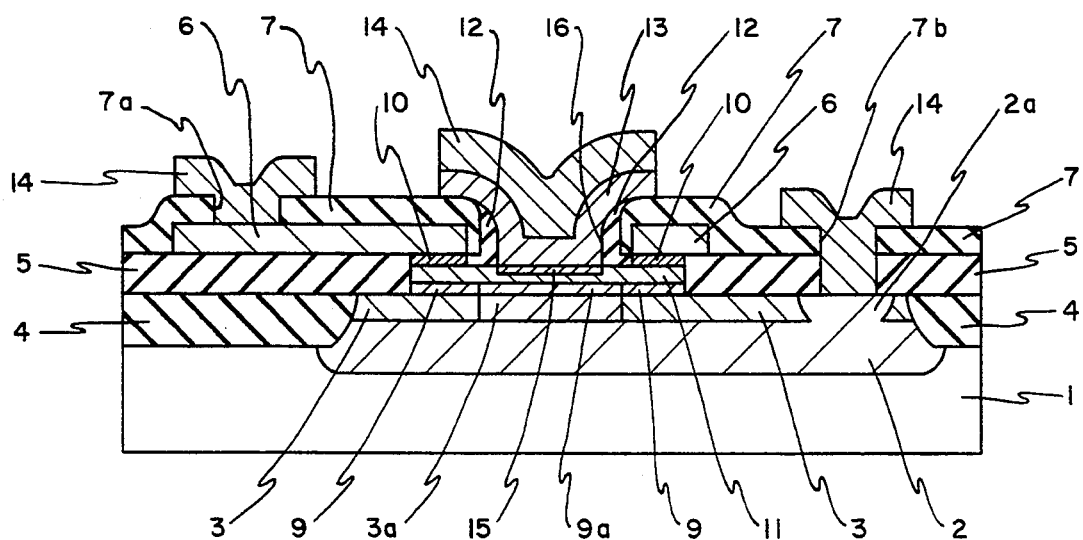
FIG. 3 is a sectional view of the bipolar transistor according to a second embodiment of the present invention.

FIG. 3 is a sectional view of the bipolar transistor according to the second embodiment of the present invention.

Figure 8:
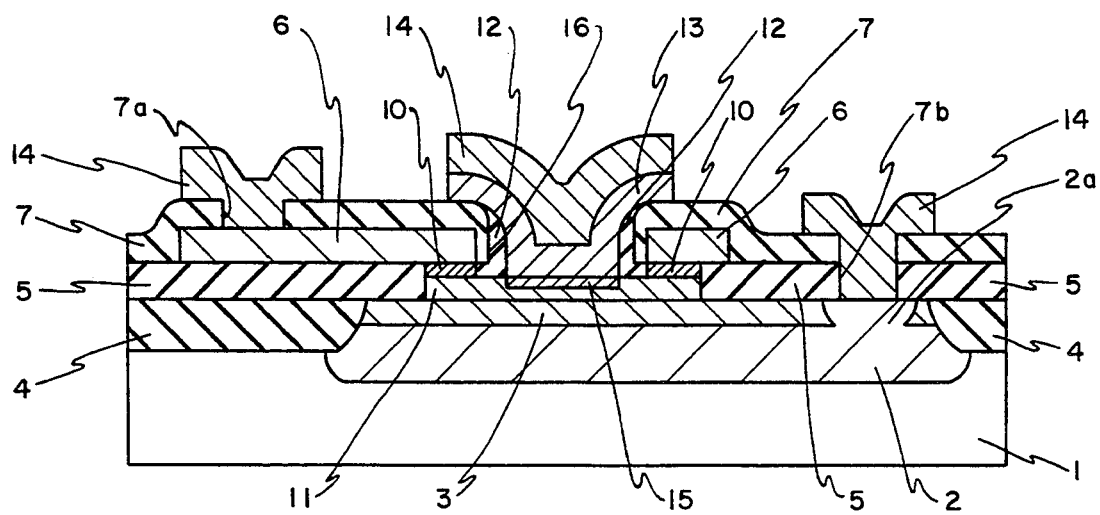
FIG. 8 is a sectional view of a prior art bipolar transistor.

The difference of this embodiment from the prior art resides in the difference of the construction between the base region 11 and the buried collector region 2, with the remaining construction being basically similar to the prior art. Therefore, the components in FIG. 3 which are identical to those in FIG. 8 are assigned identical symbols to omit further explanation.

An N-type buried collector region 2 is provided in a P-type silicon substrate 1, and an epitaxially deposited layer 3 is formed on the N-type buried collector region 2. In the epitaxial growth layer 3 there is selectively provided a phosphorus implanted region 3a where phosphorus atoms are implanted. On the epitaxial growth layer 3 there is provided a silicon film 9 with thickness of about 300 Å. In the silicon film 9 there is formed selectively an N+-type impurity region 9a where N-type impurity atoms, such as phosphorus atoms, are introduced to a concentration of about $10^{16}$ to $3 \times 10^{17}$ atom/cm$^3$. The impurity concentration of the silicon film 9 is lower than the impurity concentration of the impurity region 9a which is below about $10^{16}$ atom/cm$^3$.

On the silicon film 9 there is formed a base region 11 of thickness of 500 to 1000 Å. On the surface of the base region 11 there is selectively formed an emitter region 15 analogous to the prior art. It is to be mentioned that the phosphorus-implanted region 3a and the impurity region 9a are arranged to be substantially beneath the emitter region 15.

In the present embodiment, the silicon film 9 with low impurity concentration is provided between the base region 11 and the epitaxial growth layer 3, and the impurity region 9 with high N-type impurity concentration is arranged to be substantially beneath the emitter region 15. With this arrangement, it is possible to suppress the base push-out effect for the high current domain.

Since in this case the N-type impurity concentration of the N+-type impurity region 9a is higher than the impurity concentration in the other parts of the silicon film 9, the capacity between the collector and the base is almost determined by the base region 11 and the N+-type impurity region 9a. Further, the silicon film 9 is disposed separated from the buried collector region 2 so that the diffusion of the impurity atoms from the buried collector region 2 into the silicon film 9 can be suppressed, and the control of the impurity concentration of the silicon film 9 can be facilitated. As a result, the parasitic capacitance between the silicon film 9 and the base region 11 can be reduced sharply compared with the case in the prior art, which enables one to operate the bipolar transistor at a high speed.

FIG. 4 shows sectional views arranged in the order of processes for the fabrication of the bipolar transistor according to the present embodiment.

Figure 4A:
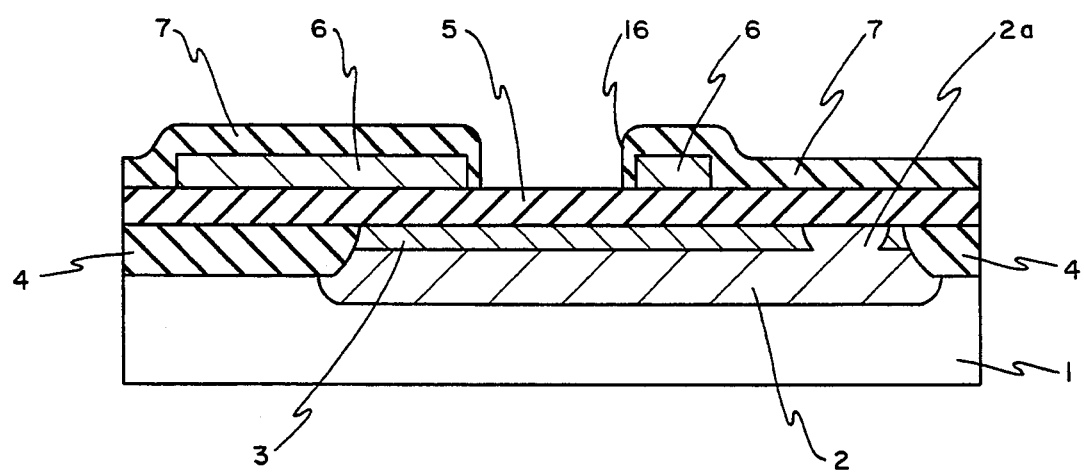
FIGS. 4(a) through (c) shows sectional views arranged in the order of the processes of fabricating the second embodiment of the bipolar transistor of the present invention.

First, as shown in FIG. 4(a), a buried collector region 2 with an impurity concentration of $10^{19}$ atom/cm$^3$ is formed by means of a diffusion method by selectively introducing arsenic atoms to the surface of a P-type silicon substrate 1. Then, an epitaxial growth layer 3 with an impurity concentration of phosphorus of the order of $10^{16}$ atom/cm$^3$ is formed on the silicon substrate to a thickness of about 0.5 μm by an epitaxial growth method. At this time, the buried collector region 2 is broadened due to the diffusion of the impurity atoms into the epitaxial growth layer 3 from the buried collector region 2. Next, a collector connecting region 2a which reaches the buried collector region 2 is formed by causing phosphorus atoms to diffuse from the surface of the epitaxial growth layer 3 at the temperature of 900° C. with an impurity concentration of $10^{18}$ to $10^{19}$ atom/cm$^3$. Then, a silicon oxide film 4 with thickness of about 1 μm which reaches the buried collector region 2 from the surface of the epitaxial growth layer is selectively formed to isolate the epitaxial growth layer 3 into a plurality of element regions by the silicon oxide film 4. Subsequently, an insulating film 5 consisting of, for example, a silicon oxide film is formed allover the surface to a thickness of about 1000 Å. Then, a P-type polycrystalline silicon film 6 with a boron impurity concentration of about $10^{20}$ atom/cm$^3$ is formed on the insulating film 5 to a thickness of about 2000 Å, and the polycrystalline silicon film 6 is patterned to a predetermined shape by photolithography.

Next, a silicon oxide film 7 is formed allover the surface to a thickness of, for example, 2000 Å. Then, an opening 16 is created by selectively removing the silicon oxide film 7 and the P-type polycrystalline silicon film 6 in the reserved region for emitter formation. Next, the side part of the polycrystalline film 6 is coated with a silicon oxide film by oxidizing the surface of the part of the polycrystalline silicon film 6 exposed to the opening 16.

Figure 4B:
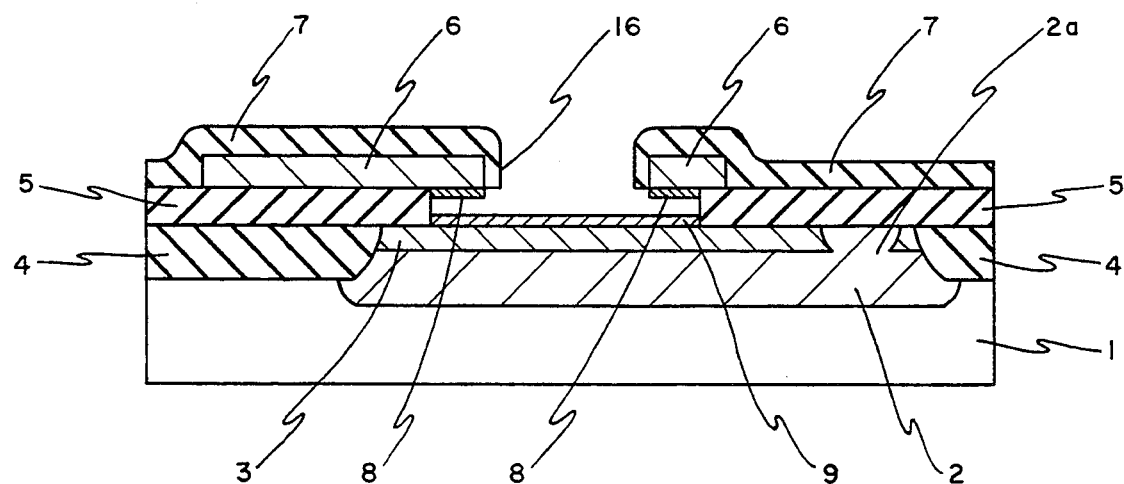

Next, as shown in FIG. 4(b), the insulating film 5 is selectively etched using the silicon oxide film 7 as the mask. At this time, spaces are formed beneath the polycrystalline silicon film 6 on the sides of the opening 16 by letting the etching to proceed also in the lateral direction (namely, in the direction along the substrate surface) to partially expose the epitaxial growth layer 3 and the polycrystalline silicon film 6. Subsequently, a silicon film 9 is formed on the part of the epitaxial growth layer 3 that is exposed to the opening 16 to a thickness of about 100 Å by means of molecular beam epitaxy, and a polycrystalline silicon film 8 is formed on the part of the bottom surface of the polycrystalline silicon film 6 that is exposed to the opening 16. For this purpose, disilane is supplied under a deposition pressure of about $10^{-4}$ Torr and a temperature in the range of 300° to 500° C. When the silicon film 9 is formed by means of an ultra high vacuum CVD method, disilane, for example, is supplied under the conditions of the deposition pressure of $10^{-4}$ Torr and a temperature in the range of 570° to 700° C. The silicon film 9 is formed of either undoped silicon with no introduction of N-type impurity atoms or N-type silicon with an impurity concentration of smaller than $10^{16}$ atom/cm$^3$. When the silicon film 9 is doped to the N-type, it is grown, for example, while supplying phosphine.

Figure 4C:
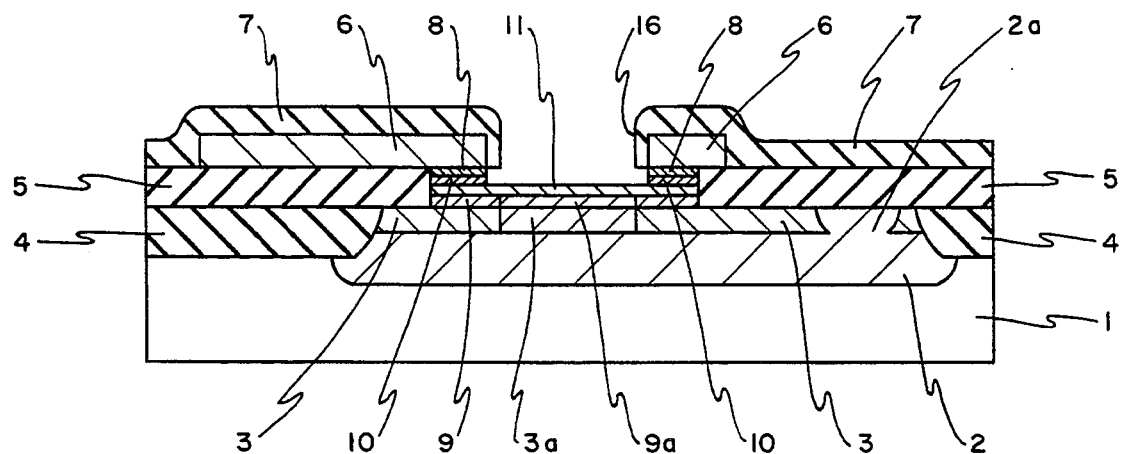

Next, as shown in FIG. 4(c), an N$^+$-type impurity region 9a and a phosphorus-implanted region 3a are formed by selectively implanting phosphorus ions into the silicon film 9 and the epitaxial growth layer 3 via the opening 16 by using the silicon oxide film 7 as the mask. Then, a base region 11 where P-type impurity atoms boron is doped with a concentration of 2 to $4\times10^{18}$ atom/cm$^3$ is formed on the silicon film 9 to a thickness of about 500 Å, and a P-type polycrystalline silicon film 10 with an impurity concentration of 2 to $4\times10^{18}$ atom/cm$^3$ is formed between the base region 11 and the silicon film 8.

Next, as shown in FIG. 3, after forming a silicon oxide film 12 with thickness of 2000 Å allover the surface by means of a low pressure CVD method, the silicon oxide film 12 is etched back to leave the silicon oxide film 12 only on the sidewalls of the opening 16. After forming an N-type polycrystalline silicon film 13 doped with arsenic atoms to an impurity concentration of $10^{20}$ to $10^{21}$ atom/cm$^3$ allover the surface, the polycrystalline silicon film 13 is patterned. Following that, an emitter region 15 with a peak impurity concentration of $10^{20}$ atom/cm$^3$ is obtained by letting arsenic atoms diffused from the polycrystalline silicon film 13 into the base region 11 by subjecting the sample to a heat treatment. At the same time, as a result of the heat treatment, the P-type impurity atoms diffuse from the P-type polycrystalline silicon films 6 and 10 into the N-type polycrystalline silicon film 8, converting the polycrystalline silicon film 8 to a part of the P-type polycrystalline silicon film 10.

Next, contact holes 7a and 7b for leading out the base and the collector are selectively formed, and an aluminum electrode 14 is selectively formed so as to fill in the contact holes 7a and 7b and to coat the silicon film 7 and the polycrystalline silicon film 13. In this way, the bipolar transistor according to the present embodiment is completed.

Now, consider as an example a bipolar transistor with an emitter region consisting of width of 1 μm and length of 2 μm, and having a base region which is brough into contact with a collector region with an impurity concentration higher than $10^{16}$ atom/cm$^3$. In contrast to the area of 6 ($=2\times3$) μm$^2$ of the base region in the conventional bipolar transistor, the substantial area of the base region according to the present embodiment is 2 ($=1\times2$) μm$^2$, an extremely small value which is one-third of the conventional value. Moreover, the capacity between the collector and the base is reduced to about one half of the conventional value.

In addition, the N$^+$-type impurity region 9a is formed via the opening 16, and the emitter region 15 is formed within the region surrounded by the oxide film formed on the inner wall of the opening 16, so that is is possible to form the region 9a and the region 15 in self-aligned fashion.

Furthermore, in accordance with the present embodiment, the N$^+$-type impurity region 9a is formed in advance of the formation of the base region 11 and the emitter region 15. Therefore, there is no need for having an ion implantation with such high energies as to drive the impurity atoms to the epitaxial growth layer 3 by way of the emitter region 15 and the base region 11. Accordingly, there will not be generated leakage currents between the emitter and the base and between the base and the collector that arise as a result of crystalline defects caused by the ion implantation.

Still further, in accordance with the present embodiment, the base width is determined by controlling the thickness of the insulating film 5 and the silicon film 9. Therefore, it is possible to obtain a bipolar transistor which can be operated at a high speed by selecting the base width small.

It should be mentioned that the base push-out effect at high current domain can also be suppressed even for a bipolar transistor in which the N$^+$-type impurity region 9a is formed by implanting phosphorus into the silicon film 9 alone, and in which case it is preferable to have available the phosphorus-implanted region 3a.

Figure 5:
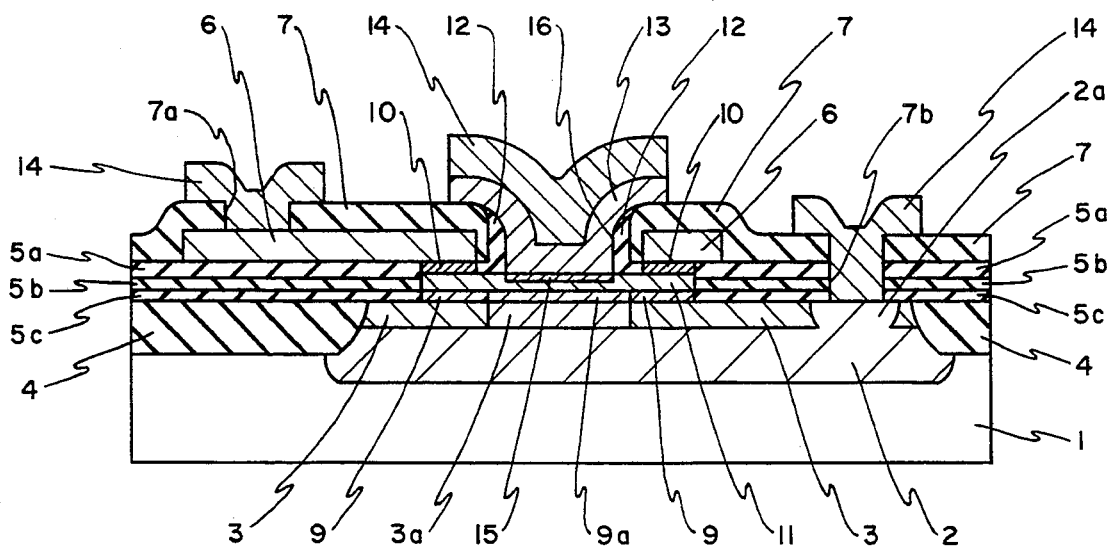
FIG. 5 is a sectional view of the bipolar transistor according to a third embodiment of the present invention.

FIG. 5 is a sectional view of the bipolar transistor according to the third embodiment of the present invention.

The feature of the present embodiment resides in the fact that the insulating film 5 of the second embodiment has a three-layered construction consisting of a silicon oxide film 5a, a silicon nitride film 5b and a silicon oxide film 5c. Since the constitution of the remaining components is the same as in the second embodiment, the same symbols are assigned to the same components to omit the further explanation.

FIG. 6 shows sectional views arranged in the order of the processes for the method of fabricating the bipolar transistor according to the present embodiment. The items in FIG. 6 which are identical to those in FIG. 4 are assigned identical symbols to omit the further explanation.

Figure 6A:
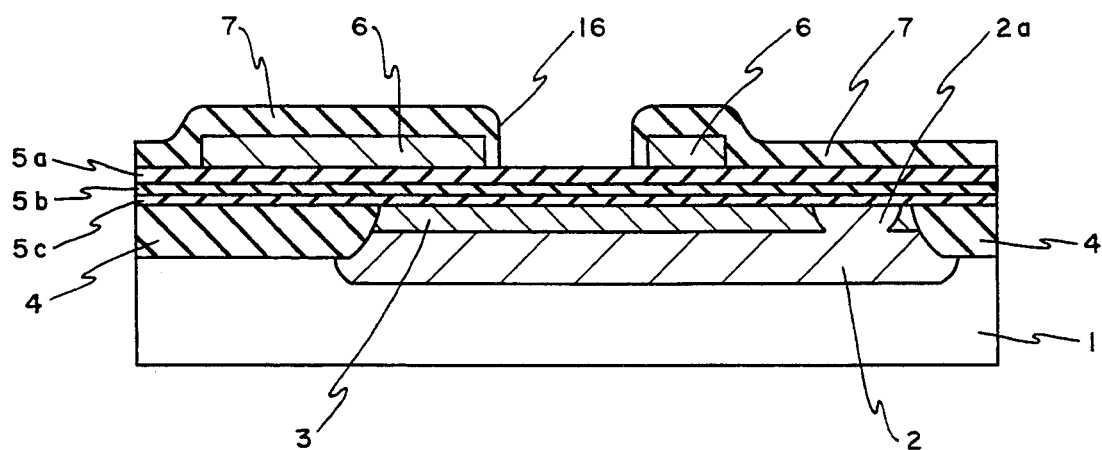
FIGS. 6(a) through (c) shows sectional views arranged in the order of the processes of fabricating the third embodiment of the bipolar transistor of the present invention.

First, as shown in FIG. 6(a), on a silicon substrate 1, there are formed a buried collector region 2 with impurity concentration of arsenic of $10^{19}$ atom/cm$^3$, an epitaxial growth layer 3 with an impurity concentration of phosphorus of the order $10^{16}$ atom/cm$^3$ and a collector connecting region 2a and a silicon oxide film 4 with an impurity concentration of phosphorus of $10^{18}$ to $10^{19}$ atom/cm$^3$. Then, a silicon oxide film 5c with thickness of 200 Å is formed allover the surface, and a silicon nitride film 5b with thickness of 400 Å and a silicon oxide film 5a with thickness of 400 Å are formed on top of the silicon oxide film 5c. Next, a P-type polycrystalline silicon film 6 with an impurity concentration of boron of about $10^{20}$ atom/cm$^3$ is selectively formed on the silicon oxide film 5a, then a silicon oxide film 7 is formed all over the surface. Subsequently, an opening 16 which reaches the silicon oxide film 5a from the surface of the silicon oxide film 7 is created in the region reserved for the formation of an emitter.

Figure 6B:
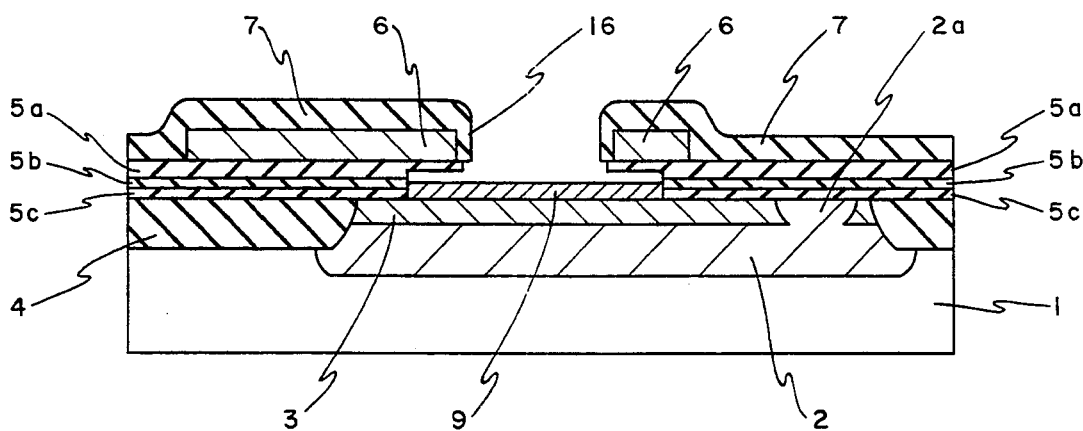

Next, as shown in FIG. 6(b), the silicon nitride film 5b is exposed by removing the silicon oxide film 5a in the opening 16 by means of an anisotropic etching method. Then, the silicon oxide film 5c is selectively exposed by removing the silicon nitride film 5b in the region obtained by etching the silicon nitride film 5b by about 5000 Å sideways by using phosphoric acid. The exposed part of the silicon oxide film 5c is removed by hydrofluoric acid to selectively expose the epitaxial growth layer 3. At this time, differing from the second embodiment, the bottom surfaces on the opening 16 sides of the polycrystalline silicon film 6 are coated with the silicon oxide film 5a. Next, a silicon film 9 is formed by growing undoped silicon or silicon doped with an N-type impurity at a concentration below, for example, about $10^{16}$ atom/cm$^3$ to a thickness of 100 to 200 Å or so on the exposed part of the epitaxial growth layer 3 by molecular beam epitaxy under the formation conditions such as those described in conjunction with the second embodiment.

Figure 6C:
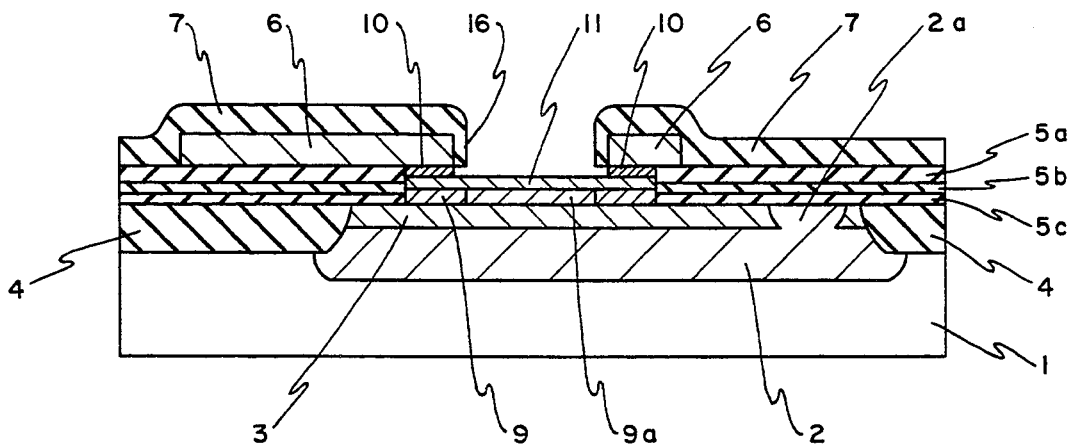

Next, as shown in FIG. 6(c), an N+-type impurity region 9a is formed by selectively implanting ions of an N-type impurity atom such as phosphorus into the silicon film 9 to a concentration of $10^{16}$ to $10^{18}$ atom/cm$^3$. Following that, the parts of the silicon oxide film 5a which are coating the bottom surface on the sides of the polycrystalline silicon film 6 are removed by hydrofluoric acid. Then, a base region 11 with a concentration of a P-type impurity atom such as boron of 2 to $4 \times 10^{18}$ atom/cm$^3$ is formed on the silicon film 9 to a thickness of about 500 Å by means of molecular beam epitaxy, and a polycrystalline silicon film 10 with an impurity concentration of boron of 2 to $4 \times 10^{18}$ atom/cm$^3$ is filled in the space between the base region 11 and the polycrystalline silicon film 6. Subsequently, an N-type polycrystalline silicon film 13 with an impurity concentration of arsenic of $10^{20}$ to $10^{21}$ atom/cm$^3$, an emitter region 15 with a peak impurity concentration of boron of $10^{20}$ atom/cm$^3$, an aluminum electrode 14 and the like are formed in a manner analogous to the second embodiment. In this way, the bipolar transistor as shown in FIG. 5 is completed.

In the fabrication method of the second embodiment, in establishing the electrical connection between the base region 11 and the P-type polycrystalline silicon film 6, the P-type impurity atoms are diffused from the P-type polycrystalline silicon films 6 and 10 to the N-type polycrystalline silicon film 8, thereby converting the N-type polycrystalline silicon film 8 to a part of the P-type polycrystalline film 10 (the process illustrated in FIG. 4(c)). Accordingly, the N-type impurity atoms are included in the P-type polycrystalline silicon film 10 of the second embodiment. In contrast, in the bipolar transistor according to the fabrication method of the present embodiment, no N-type impurity atoms are included in the polycrystalline silicon film 10, so that there is an advantage that the possibilities of generating such inconveniences as the increase in the base resistance and the unsatisfactory connection of the base lead-out part do not exist.

It should be noted that the silicon film 9 can be formed by means of an ultra high vacuum CVD method in the present embodiment, too. For example, the silicon film 9 may be formed by supplying disilane at a temperature in the range of 570° to 700° C. and a vacuum of $10^{-4}$ Torr. If an N-type doping is desired, one only needs to grow the film while supplying, for example, phosphine in addition.

Figure 7:
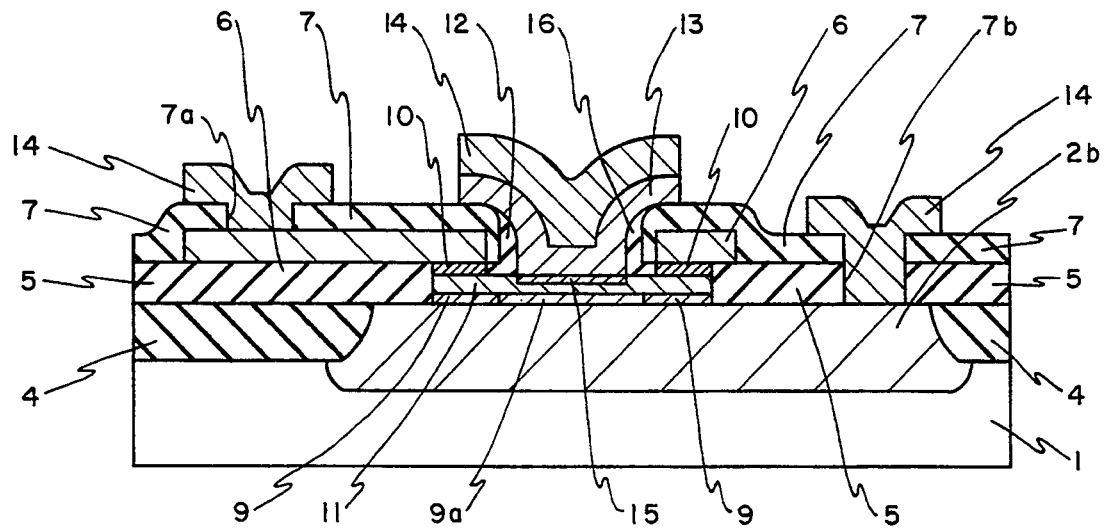
FIG. 7 is a sectional view of the bipolar transistor according to a fourth embodiment of the present invention.

FIG. 7 is a sectional view of the bipolar transistor according to the fourth embodiment of the present invention.

The difference of the present embodiment from the second embodiment resides in the fact that there is not provided an epitaxial growth layer 3. Since the remaining structure is basically the same as that of the second embodiment, items in FIG. 7 identical to those in FIG. 3 are assigned identical symbols to omit detailed explanation.

On the surface of a silicon substrate 1 there is selectively formed a silicon oxide film 4 for element isolation, and a collector region 2b with an N-type impurity concentration of $10^{19}$ atom/cm$^3$ is formed in the region surrounded by the silicon oxide film 4. On the collector region 2b there is formed selectively a silicon film 9, and a base region 11 with an impurity concentration of boron of 2 to $4 \times 10^{18}$ atom/cm$^3$ is formed on the silicon film 9. On the surface of the base region 11 there is provided an emitter region 15 with a peak impurity concentration of arsenic of $10^{20}$ atom/cm$^3$, and an N+-type impurity region 9a with an impurity concentration of phosphorus of $10^{16}$ to $10^{17}$ atom/cm$^3$ is provided on the silicon film 9 below the emitter region 15.

On the silicon film 9 and the collector region 2b exclusive of the region where the base region 11 is formed, and on the silicon oxide film 4, there is formed an insulating film 5. On the insulating film 5 there are formed a P-type polycrystalline silicon film 6 and a silicon oxide film 7 similar to the second embodiment. Further, on the base region 11, there are formed a silicon oxide film 12, an N-type polycrystalline silicon film 13 for emitter lead-out with an impurity concentration of arsenic of $10^{20}$ to $10^{21}$ atom/cm$^3$ and an aluminum electrode 14 are formed analogous to the second embodiment.

In the space between the base region 11 with an impurity concentration of boron of 2 to $4 \times 10^{18}$ atom/cm$^3$ and the P-type polycrystalline silicon film 6 with an impurity concentration of boron of about $10^{20}$ atom/cm$^3$, there is formed a P-type polycrystalline silicon film 10. The film 10 is formed simultaneous with the formation of the base region 11. The base region 11 is electrically connected to an aluminum electrode 14 which fills in a contact hole 7a via the polycrystalline silicon films 10 and 6. Further, the collector region 2b is electrically connected to the aluminum electrode 14 which fills in a contact hole 7b that reaches from the surface of the silicon oxide film 7 to the collector region 2b.

The bipolar transistor of the present embodiment can be formed similar to the second embodiment except that the epitaxial growth layer is not formed. Namely, a silica film of arsenic is formed on the silicon substrate 1, a collector region 2 with an impurity concentration of $10^{19}$ atom/cm$^3$ is formed by thermal diffusion. Then after removing the silica film of arsenic, a silicon oxide film 4 for element isolation is formed by a selective oxidation method. In this case, a low concentration N-type silicon film 9 is formed on a collector region 2b by supplying disilane and phosphine under a temperature in the range of 300° to 500° C. and a deposition pressure of $10^{-6}$ Torr. Accordingly, it is possible to form an N-type silicon film 9 at a relatively low temperature, and to avoid diffusion of the N-type impurity atoms from the collector region 2b to the silicon film 9. In this way, it is possible to avoid such inconveniences as an increase in the capacity between the base and the collector and the deterioration in the breakdown voltage between the base and the collector due to the impurity atoms that diffuse from the collector region 2b. Moreover, in the present embodiment, there is an advantage that it is unnecessary to form the epitaxial growth layer 3 and the collector connecting region 2a (see FIG. 3) so that it is possible to sharply reduce the fabrication steps compared with the case of the second embodiment. In the present embodiment, too, the silicon film 9 may be formed by means of an ultra high vacuum CVD method.

As in the above, according to the present invention, a base region of a first conductivity type is formed on a silicon film on a collector region of a second conductivity type and an impurity region of the second conductivity type with impurity concentration higher than in other parts is provided in the silicon film substantially beneath the emitter region formed on the surface of the base region. Therefore, it is possible to suppress the reduction in the cut-off frequency due to the base push-out effect, and to reduce the capacity between the base and the collector so that a bipolar transistor that can be operated at high speed can be obtained.

Further, according to the fabrication method of the present invention, a silicon film is formed on a collector region by means of an ultra high vacuum CVD method or a molecular beam epitaxy, so that it is possible to form the silicon film at a relatively low temperature. As a result, it is possible to suppress the diffusion of the impurity atoms into the silicon film from the collector region, and maintain the impurity concentration of the silicon film at a predetermined level. Accordingly, a bipolar transistor with small capacity between the base and the collector that is operatable at a high speed can readily be fabricated by the present invention.

Although the invention has been described with reference to specific embodiments, this description is not meant to be construed in a limiting sense. Various modifications of the disclosed embodiments, as well as other embodiments of the invention, will become apparent to persons skilled in the art upon reference to the description of the invention. It is therefore contemplated that the appended claims will cover any modifications or embodiments as fall within the true scope of the invention.

What is claimed is:

1. A semiconductor device comprising a collector region, a first insulating film covering said collector region, a first hole provided in said first insulating film to expose a part of said collector region, a semiconductor layer formed on said part of said collector region and defined by said first hole, a base region formed on said semiconductor layer and defined by said first hole, an emitter region selectively formed in said base region, said semiconductor layer having a first portion and a second portion surrounding said first portion, said first portion facing said emitter region and having a conductivity type equal to said collector region and an impurity concentration which is higher than an impurity concentration of said second portion, said first portion being in direct contact with said base region to form a PN junction between said first portion and said base region, a polysilicon conductive layer formed on said first insulating film and having a portion projecting from an edge of said first hole over said base region, and a conductive layer formed between said portion of said polysilicon layer and a part of said base region to form a conductive path therebetween.

2. The device as claimed in claim 1, further comprising a second insulating film covering said polysilicon layer and said conductive layer, a second hole formed in said second insulating film to expose a part of said emitter region, and an emitter electrode formed in contact with said part of said emitter region through said second hole.

3. The device as claimed in claim 2, wherein said conductive layer comprises a polycrystalline semiconductor film.

4. The device as claimed in claim 2, wherein said conductive layer comprises a polycrystalline semiconductor film formed in contact with said polysilicon layer and a monocrystalline semiconductor film formed between said polycrystalline semiconductor layer and said part of said base region in contact therewith.

5. The device as claimed in claim 2, wherein said collector region includes a first layer having said portion exposed by said first hole and a second layer having an impurity concentration higher than an impurity concentration of said first layer, said first layer further having an active portion formed between said first portion of said semiconductor layer and said second layer in contact therewith, said active portion having an impurity concentration which is higher than the impurity concentration of a remaining portion of said first layer.

6. A semiconductor device comprising a collector region having a first layer and a second layer formed on said first layer and having an impurity concentration which is lower than the impurity concentration of said first layer, a first insulating film formed on said first layer of said collector region, a first hole selectively formed in said first insulating film to expose a part of said second layer, a semiconductor layer formed on said part of said second layer and defined by said first hole, a base region formed on said semiconductor layer and defined by said first hole, an emitter region selectively formed in said base region, said semiconductor layer having a first portion and a second portion surrounding said first portion, said first portion facing said emitter region and having a conductivity type equal to said collector region and an impurity concentration which is higher than the impurity concentration of said second portion, said first portion being in direct contact with said base region to form a PN junction between said first portion and said base region, said second layer having an active portion having an impurity concentration which is higher than the impurity concentration of a remaining portion of said second layer and being formed between said first portion of said semiconductor layer and said first layer of said collector region in contact therewith, a polysilicon layer formed on said first insulating film and having a portion projecting from an edge of said first hole over said base region, and a polycrystalline semiconductor film formed between said portion of said polysilicon layer and a part of said base region in contact therewith.

7. The device as claimed in claim 6, further comprising a second insulating film cover said polysilicon layer and said polycrystalline semiconductor film, a second hole formed in said second insulating film to expose a part of said emitter region, and an emitter electrode formed in contact with said part of said emitter region through said second hole.

8. The device as claimed in claim 7, wherein said emitter electrode comprises a polycrystalline silicon layer formed in contact with said part of said emitter region and a metal layer formed on said polycrystalline silicon layer.

9. A semiconductor device comprising a collector region, a first insulating film covering said collector region, a first hole provided in said first insulating film to expose a part of said collector region, a semiconductor layer formed on said part of said collector region and defined by said first hole, a base region formed on said semiconductor layer and defined by said first hole, an emitter region selectively formed in said base region, said semiconductor layer having a first portion and a second portion surrounding said first portion, said first portion facing said emitter region and having a conductivity type equal to a conductivity type of said collector region and an impurity concentration which is higher than an impurity concentration of said second portion, a polysilicon conductive layer formed on said first insulating film and having a portion projecting from an edge of said first hole and over said base region, and a conductive layer formed between said portion of said polysilicon layer and a part of said base region to form a conductive path therebetween, said base region having a first bottom portion located under said emitter region and a second bottom portion located under said conductive layer and said first and second bottom portions being uniform in depth with each other.

10. The device as claimed in claim 9, wherein said first portion of said semiconductor layer is in direct contact with said base region to form a PN junction between said first portion and said base region.

* * * * *